United States Patent
Shah et al.

(10) Patent No.: US 11,936,383 B2
(45) Date of Patent: Mar. 19, 2024

(54) BIAS-LESS DYNAMIC MILLER CLAMP

(71) Applicant: Tagore Technology, Inc., Arlington Heights, IL (US)

(72) Inventors: Manish Shah, Vernon Hills, IL (US); Procheta Chatterjee, Kolkata (IN); Syed Asif Eqbal, Patna (IN)

(73) Assignee: Tagore Technology, Inc., Arlington Heights, IL (US)

( * ) Notice: Subject to any disclaimer, the term of this patent is extended or adjusted under 35 U.S.C. 154(b) by 0 days.

(21) Appl. No.: 17/539,564

(22) Filed: Dec. 1, 2021

(65) Prior Publication Data
US 2023/0170882 A1    Jun. 1, 2023

(51) Int. Cl.
| | |
|---|---|
| H03K 17/00 | (2006.01) |
| H03K 3/013 | (2006.01) |
| H03K 17/16 | (2006.01) |
| H03K 17/687 | (2006.01) |

(52) U.S. Cl.
CPC ............ *H03K 3/013* (2013.01); *H03K 17/16* (2013.01); *H03K 17/687* (2013.01)

(58) Field of Classification Search
CPC .... H03K 17/165; H03K 17/687; H03K 17/16; H03K 3/013
See application file for complete search history.

(56) References Cited

U.S. PATENT DOCUMENTS

| | | | | |
|---|---|---|---|---|
| 5,612,582 | A * | 3/1997 | Shichi | H03K 17/04206 307/130 |
| 5,818,281 | A * | 10/1998 | Ohura | H02M 7/538 327/198 |
| 5,920,221 | A * | 7/1999 | Shen | H03K 5/133 327/264 |
| 7,660,094 | B2 * | 2/2010 | Urakabe | H03K 17/6871 361/111 |

(Continued)

FOREIGN PATENT DOCUMENTS

JP    2013-146008 A  *  7/2013

OTHER PUBLICATIONS

"AN-5073 Active Miller Clamp Technology", www.fairchildsemi.com, Dec. 2, 2014, Fairchild Semiconductor Corporation, US.

(Continued)

*Primary Examiner* — Tuan T Lam
(74) *Attorney, Agent, or Firm* — Fleit Intellectual Property Inc.; Jose Gutman (57) ABSTRACT

An electronic circuit, integrated circuit, and method for a bias-less Miller clamp protection circuit, electrically coupled to an output of a driver circuit and to an input gate of a semiconductor switch device, for dynamically protecting the semiconductor switch device from turning from an off state to an on state in response to a parasitic Miller turn-on signal at the gate, regardless of the bias-less Miller clamp protection circuit having, or lacking, a power supply that provides electrical power to the bias-less Miller clamp (Continued)

protection circuit. The semiconductor switch device can include one or more GaN switch devices. The bias-less Miller clamp protection circuit does not consume any current during normal operation of the electronic circuit and also does not cause any interference to the normal operation.

20 Claims, 4 Drawing Sheets

(56) References Cited

U.S. PATENT DOCUMENTS

| | | | | |
|---|---|---|---|---|
| 8,913,362 | B2* | 12/2014 | Simmonds | H01L 27/0255 361/91.1 |
| 9,755,639 | B2* | 9/2017 | Kampl | H03K 17/74 |
| 10,734,882 | B2* | 8/2020 | Chao | H03K 17/162 |
| 11,031,935 | B2* | 6/2021 | Arisawa | H03K 17/6877 |
| 2005/0106791 | A1* | 5/2005 | You | H01L 29/66681 257/E21.639 |
| 2008/0087963 | A1* | 4/2008 | Calafut | H01L 27/0255 257/363 |
| 2010/0134941 | A1* | 6/2010 | Nakahara | H03K 17/0822 361/91.1 |
| 2011/0148376 | A1* | 6/2011 | Xu | H03K 17/165 327/434 |
| 2014/0198423 | A1* | 7/2014 | Anand | H02H 7/222 361/93.9 |
| 2020/0371139 | A1* | 11/2020 | Dubois | G01R 19/16519 |
| 2021/0105010 | A1* | 4/2021 | Chao | H03K 17/163 |
| 2021/0152178 | A1* | 5/2021 | Iwamoto | H03K 19/0944 |
| 2022/0123741 | A1* | 4/2022 | Shao | H01L 29/2003 |

OTHER PUBLICATIONS

"Active Miller Clamp", Application Note 5314, www.avagotech.com, Jul. 21, 2010, Avago Technologies, US.

"Impacts of the dv-dt Rate on MOSFETs", Jul. 26, 2018, Toshiba Electronic Devices & Storage Corporation.

Anselmo Liberti et al., "Mitigation technique of the SiC MOSFET gate voltage glitches with Miller clamp", ST Life Augmented, www.st.com, Jul. 2019, STMicroelectronics.

"MOSFET Self-Turn-On Phenomenon", Jul. 26, 2018, Toshiba Electronic Devices & Storage Corporation.

Eddy Aeloiza et al., "Novel Bipolar Active Miller Clamp for Parallel SiC MOSFET Power Modules", 2018, ABB Corporate Research Center.

Dusan Graovac, "Parasitic Turn-on of Power MOSFET How to avoid it?", Dec. 29, 2008, Infineon Technologies.

"Tips for Practical Use: Gate Driving—Part 2", Basic Knowledge, Rohm Tech Web, Technical Information Site of Power Supply Design, Sep. 6, 2018, Rohm Semiconductor, Koyoto, Japan.

* cited by examiner

BIAS-LESS DYNAMIC MILLER CLAMP

BACKGROUND

Field

The present disclosure generally relates to electronic circuits for protection of active solid-state devices from unwanted parasitic turn-on, and more specifically to such electronic circuits for protection of gallium nitride (hereinafter "GaN") high-electron-mobility transistor (hereinafter "HEMT"), devices used as power switches.

Related Art

Figure 1:
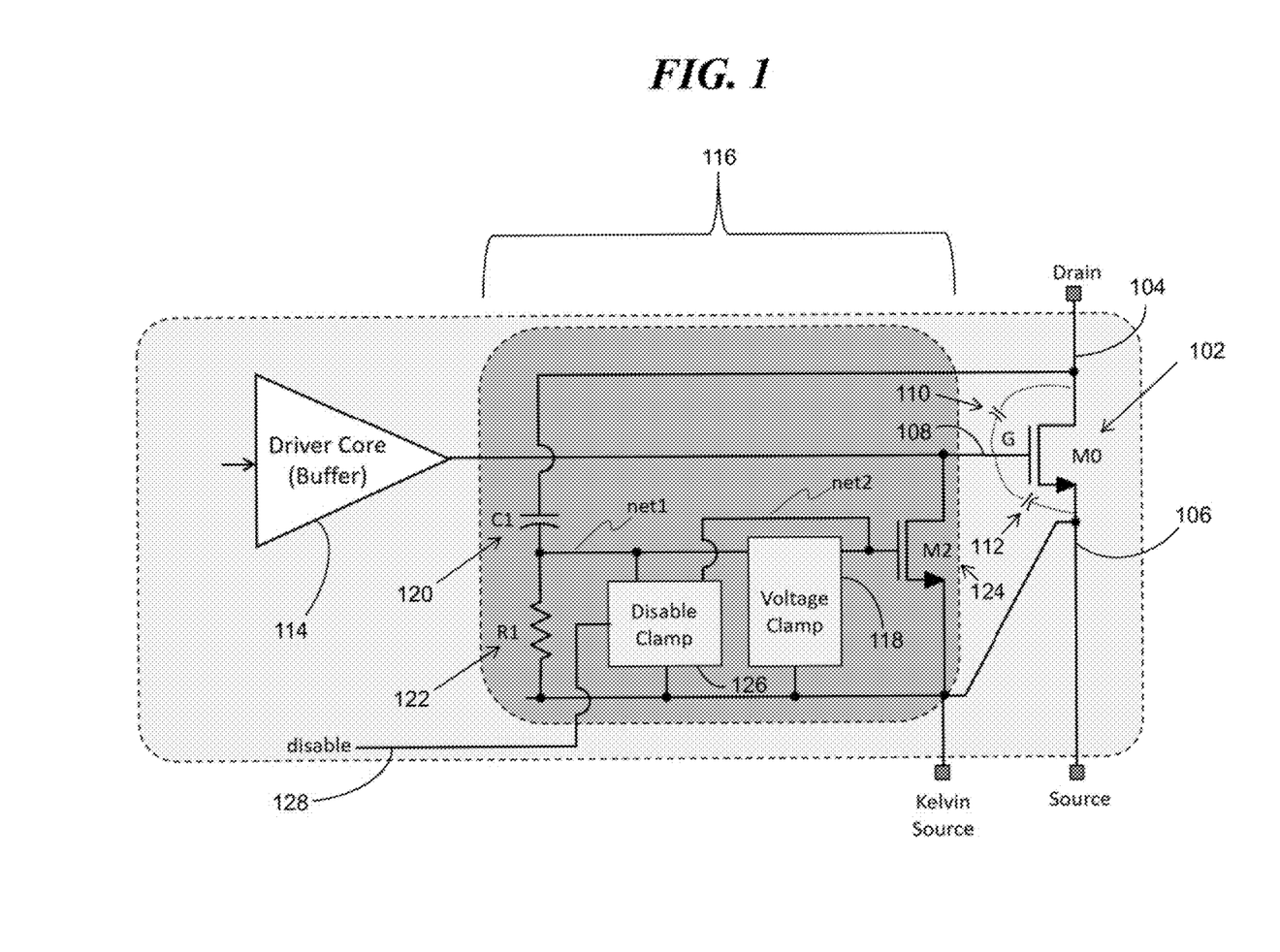
FIG. 1 is a simplified block diagram of an example integrated circuit comprising a driver circuit that drives a power FET switch which can include one or more GaN switch devices, and a protection circuit that can protect the power FET switch from unwanted parasitic turn-on, according to various embodiments of the invention.

A power switch 102 such as shown in FIG. 1 in response to its drain node undergoing a rapid voltage change, experiences a current at its gate 108 due to a parasitic capacitor divider forming out of a drain-to-gate 104, 108, parasitic capacitor 110 and a gate-to-source 108, 106, parasitic capacitor 112 as shown in FIG. 1.

For the case of a positive voltage change across the drain-source (henceforth called +dv/dt), the current tends to raise the gate voltage, and may turn on the power switch (e.g., a power FET or a power HEMT), causing catastrophic failure of the power switch and/or other power devices connected in series. This phenomena may be referred to as a Miller turn-on, a parasitic turn-on, a self turn-on, or a false turn-on. In power switch applications, +dv/dt at a switch typically occurs when the power switch is in its off state. Usually, a driver circuit 114 (which may also be referred to as a buffer, a driver, a driver buffer, a driver circuit buffer, a driver core, or the like) of the power switch 102, as shown in FIG. 1, can take care of this scenario by draining out a parasitic gate current, and thereby maintaining the off state of the power switch 102. However, there are cases where the driver circuit 114 might not be able to drain out a parasitic gate current. For example, and not for limitation, during startup of an integrated circuit, a supply voltage for the driver circuit 114 and/or for a protection circuit may not be yet available or may not be at a stable voltage thereby rendering the driver circuit 114 inoperable and/or at an unreliable operation stage.

A strong enough driver buffer 114, when operable, will typically be able to drain out a parasitic current rapidly, and keep the power switch 102 off. However, in general, when a supply voltage for a driver circuit 114 is not present or is below a required level, the driver circuit 114 would not be functional, or would be only partially functional, and then the driver circuit would fail to suppress the parasitic turn-on of the power switch 102. Two example cases are described below.

In a universal half-bridge (UHB), the driver circuit 114 of a high side gets its supply from an ad hoc bootstrapping circuit, which relies on switching of a low side of the UHB for its working. Therefore, at the very beginning, when no switching has yet happened, a supply voltage of the high side starts at zero, and it might take several cycles of switching before voltage from the bootstrapping circuit reaches sufficient level for the driver circuit 114 of the high side to be operational. Under such a scenario, whenever a low-side switch is turned on, the high side experiences a +dv/dt while the driver circuit 114 is not functional.

Another possible case is when in a UHB application, the main power supply, that is, the input supply to the power loop, is turned on, and the driver supply to the low side is still not up and ready. Under this case, the net dv/dt of the main supply will get divided between the high-side and the low-side switches, and this may turn on either or both of them.

The above example scenarios are not limited to UHB, but are rather common occurrences across a variety of power electronics topologies.

In the past, protection circuits (e.g., Miller clamp circuits) intended to prevent a power switch, e.g., a power FET or a power HEMT, from false turn-on either increased the switching losses of the power switch circuit or increased quiescent current of the circuits, particularly when fabricated in GaN technology. Additionally, all such protection circuits required a stable supply voltage for the driver circuit and/or for the protection circuit to be present to provide proper bias current to all active solid-state devices in the protection circuit.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

It is to be understood that the present disclosure will be described in terms of given illustrative examples. However, other semiconductor architectures, structures, substrate materials, and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Various embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used as part of a process in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip can be then integrated with other chips, discrete circuit elements, and/or other signal processing devices as part of either (a) an intermediate product, such as a motherboard, or (b) an end product. The end product can be any product that includes integrated circuit chips, such as for example, and not for limitation, chargers for mobile phones and laptops, supply for desktops, servers and mobile base-stations, LED and motor drives, AC-DC, DC-DC, and DC-AC converters, power factor correction and LLC-topology converters, converters for automotive uses including its chargers, and many other commercial applications and military applications.

In view of the discussion above and the problems experienced by power switches in the past, it should be noted that gallium nitride (hereinafter "GaN") high-electron-mobility transistor (hereinafter "HEMT") devices are often used as semiconductor power switches which are devices capable of switching at high speed. In fact, the high switching speed is one of the main driving forces for widespread deployment of GaN in a number of practical applications. The high speed of GaN makes a high dv/dt unwanted parasitic turn-on signal even more likely to occur, and hence a Miller clamp protection circuit becomes an even more important feature.

Further, commercially available GaN switches (by which is intended to mean switches based on GaN technology only, and not on a cascade of silicon and GaN technologies) typically have a low turn-on gate threshold. Most reported numbers are about 1.5V at room temperature, which is a considerably lower gate turn-on voltage than, for example, a 3V and above of a threshold gate turn-on voltage typical for silicon power FETs. This means that even a small rise in gate voltage due to an unwanted parasitic +dv/dt voltage signal can cause a GaN power switch to turn on.

Various embodiments of the invention, as will be discussed more fully below, provide an integrated solution to the past troublesome issues of unwanted parasitic turn-on gate voltage at the gate of a power switch that can turn on the power switch even while a supply voltage for a driver circuit and/or for a protection circuit is absent.

Further, in certain embodiments, all the devices of the integrated solution can be realized by including only GaN HEMT devices and resistors or capacitors that can be fabricated using available GaN processes, and can be easily integrated with a power GaN switch device itself.

The solution, according to various embodiments, enjoys the advantage of a single GaN die, which provides excellent response and performance parameters, while also providing reduction of fabrication cost and complexity arising from using another separate die for part of an overall circuit.

Prior attempts to solve the problem (e.g., to prevent a power FET switch from false turn-on) have been typically accompanied by increasing switching losses of the power FET circuit, by increasing quiescent current of the circuit such as if fabricated in GaN technology, by requiring external components and negative supply voltage, or by a combination of these accompanying problems, and which in all cases have required a stable supply voltage to be present for a driver circuit and/or for a protection circuit.

Although, various examples shown and described herein may include GaN technology and/or GaN HEMT based technology, an example solution circuits' topology and its application are understood to be independent of the device technology platform, and can be easily extended to silicon or to other present or future semiconductor technology platforms.

Referring now to the drawings in which like numerals represent the same or similar elements, FIG. 1 shows an example integrated circuit 100 comprising a driver circuit 114 that drives a power FET switch 102 which can include one or more GaN switch devices, and a Miller clamp protection circuit 116 that can protect the power FET switch 102 from unwanted parasitic turn-on signals, according to various embodiments of the invention. It should be understood that the present disclosure is applicable also to a driver circuit 114 and a Miller clamp protection circuit 116, coupled to the inputs of a plurality of discrete GaN switch devices 102 which may get switched on in response to unwanted parasitic turn-on voltage signals at their respective input gate(s) 108.

For example, and not for limitation; when a drain node 104 (see FIG. 1) of a power FET switch 102 undergoes a rapid voltage change signal (e.g., +dv/dt signal) such as during booting of the driver 114 and the power FET switch 102 circuit, the power FET switch 102 can experience a current at its gate 108 due to the parasitic capacitor divider forming via a drain-to-gate parasitic capacitor 110 and a gate-to-source parasitic capacitor 112. This can generate an unwanted parasitic turn-on voltage signal at the gate 108 relative to the source 106, which can turn on the power FET switch 102 between the drain 104 and the source 106. This unwanted physical phenomenon can result in catastrophic failure of the power FET switch 102 and/or other electronic circuit devices connected in series to the power FET switch 102.

As illustrated in the example shown in FIG. 1, M0 is the power FET switch (hereinafter "power switch") 102, and the driver circuit 114 turns on/off the power switch M0 102. According to various embodiments, the power switch 102, the driver circuit 114, and the Miller clamp protection circuit 116 will be describe in more detail while the rest of circuit elements (not shown) in a typical practical design, can be considered to be included in a solution according to various application environments of the disclosure.

As shown in FIG. 1, the Miller clamp protection circuit 116 comprises a capacitor C1 120, or a device able to act as a capacitor, and one side of this capacitor is electrically coupled (e.g., connected) to the drain 104 node of a switch device M2 124 and the other side of the capacitor is electrically coupled (e.g., connected) to the gate of a switch device M2 124 through a voltage clamp 118, as will be discussed in more detail below.

Any +dv/dt voltage signal between the drain 104 node and the source 106 node is detected by the capacitor C1 120, and the +dv/dt signal is coupled through the capacitor 120 which charges/discharges net1 in the Miller clamp protection circuit 116.

Figure 2:
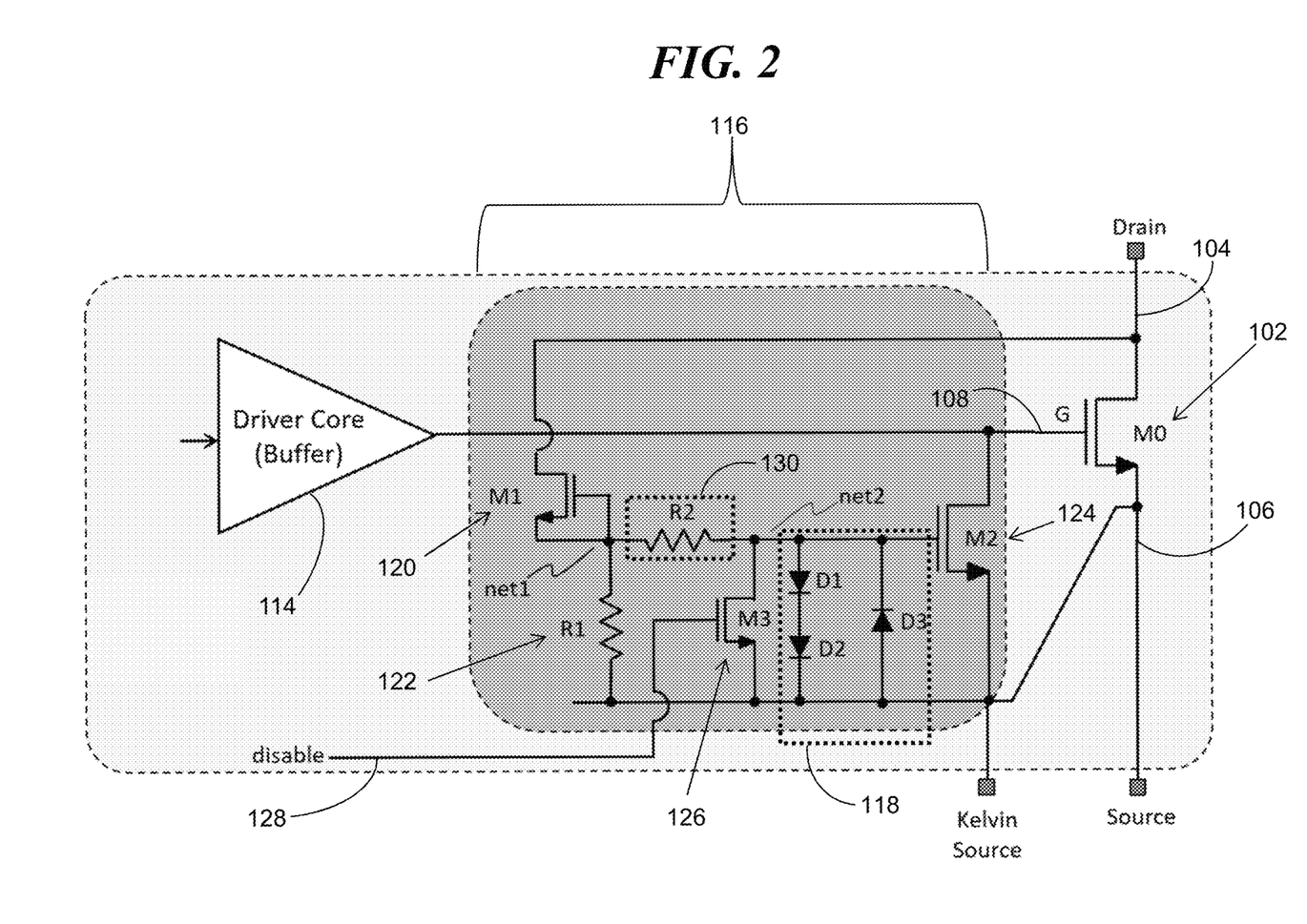
FIG. 2 is a more detailed block diagram of the example integrated circuit of FIG. 1.

In summary, the bias-less Miller clamp protection circuit 116 includes a capacitor C1 120, or a device M1 120 operating like a capacitor (as shown in FIG. 2), with one side of the capacitor 120 being electrically coupled to the drain 104 of a semiconductor power switch device 102 and another side of the capacitor 120 being electrically coupled to net1 in the protection circuit 116. The capacitor 120 detects (which may also be referred to as "picks up", "receives", "electrically couples", and the like) a parasitic Miller turn-on signal that is present at the drain 104 of the semiconductor power switch device 102. The capacitor 120 then electrically couples to net1 in the bias-less Miller clamp protection circuit 116, the parasitic Miller turn-on signal, thereby dynamically protecting (preventing) the semiconductor power switch device 102 from turning from an off state to an on state in response to the parasitic Miller turn-on signal being present between the drain 104 and the gate 108 of the semiconductor switch device 102.

For example, a positive dv/dt voltage signal between the drain 104 node and the source 106 node will increase the voltage level in net1. A rise in voltage in net1 will pass through the voltage clamp 118 to cause a rise in voltage in net2. The rise in voltage in net2 will dynamically turn on the switch M2 124 in the Miller clamp protection circuit 116, subject to a limit in the increasing voltage provided by the voltage clamp 118 in the Miller clamp protection circuit 116. When the switch M2 124 turns on, it effectively clamps the voltage signal at the gate G 108 of the power switch M0 102. While the switch M2 124 is turned on, the input voltage at the gate G 108 of the power switch M0 102 is maintained at a voltage level that closely tracks a voltage level at the source 106 node of the power switch M0 102. A Kelvin source could be provided to the Miller clamp protection circuit 116 as shown to help maintain the voltage level at the gate G 108 (coupled via the switch M2 124 when it is turned on) substantially the same voltage as the voltage level at the source 106 node of the power switch M0 102. The power switch M0 102 thereby will remain turned off while an unwanted parasitic voltage signal is generated from the drain 104 node and coupled to the gate G 108 node of the power switch M0 102.

If the dv/dt signal between the drain 104 node and the source 106 node is negative, then net1/net2 will go negative, subject to a limit provided by the voltage clamp 118. Under this scenario, switch M2 remains off, and the disclosed set of circuit components does not interfere with a normal operation of the driver circuit 114 and the gate of the switch device 102. It is to be noted that a negative dv/dt signal across the drain 104 node and the source 106 node is expected when the power switch M0 102 turns on, and the disclosed set of circuit components not interfering with a normal operation of the driver circuit 114 and the gate of the switch device 102 will be a desired feature under such a scenario.

A purpose of the voltage clamp 118 is to limit the voltage range at node net1 and node net2 so as to protect the switch M2 124 and other devices connected to node net1 and node net2.

An optional R1 122 can be provided for adjusting the reset time of the Miller clamp protection circuit 116.

An optional disable clamp 126 can be provided such that, in response to a disable signal being coupled to an input 128 of the disable clamp 126, the disable clamp 126 to clamp clamps a voltage level at node net1 and node net2 thereby turning off the switch M2 124. This optional disable clamp 126 can disable the operation of the bias-less Miller clamp protection circuit 116.

FIG. 2 shows one embodiment of the Miller clamp protection circuit 116 where the capacitor C1 120 is replaced with a GaN HEMT device M1 120. Because the full drain node to source node voltage across the switch M0 102 also appears across the GaN HEMT device M1 120, the GaN HEMT device M1 is selected to have the corresponding voltage rating.

A resistor R2 130, as shown in the net1 circuit, can limit the voltage at the net2 circuit. The resistor R2 130 could be shorted if not needed.

The resistor R1 122 provides a discharge path, and can be adjusted to set a time constant for node net1 and node net2, which in turn determines a reset time of the overall bias-less Miller protection circuit 116, according to various embodiments. Under an extreme case, if desired, R1 122 can be removed (open-circuited) altogether.

The diode combination of D1 and D2 in the voltage clamp 118 clamps the positive voltage at net1, and the diode D3 in the voltage clamp 118 clamps the negative voltage at net2. Depending on need and available devices, the number of diodes can be increased or they can be changed with Zener diodes or some other suitable clamping devices.

The disable clamp device M3 126 will be off (open-circuit) if a driver-supply is not available, or if the disable signal 128 is low. Under this condition, disable clamp device M3 126 will not interfere with the operation of the rest of the Miller clamp protection circuit 116. When disable signal 128 goes high, the disable clamp device M3 126 will turn on and will disable the overall operation of the Miller clamp protection circuit 116.

The switch device M2 124, as explained earlier, is the power-switch-gate's clamp device, and when the switch device M2 124 is turned on, it provides the clamping action to the gate 108 of the power switch device M0 102.

Figure 3:
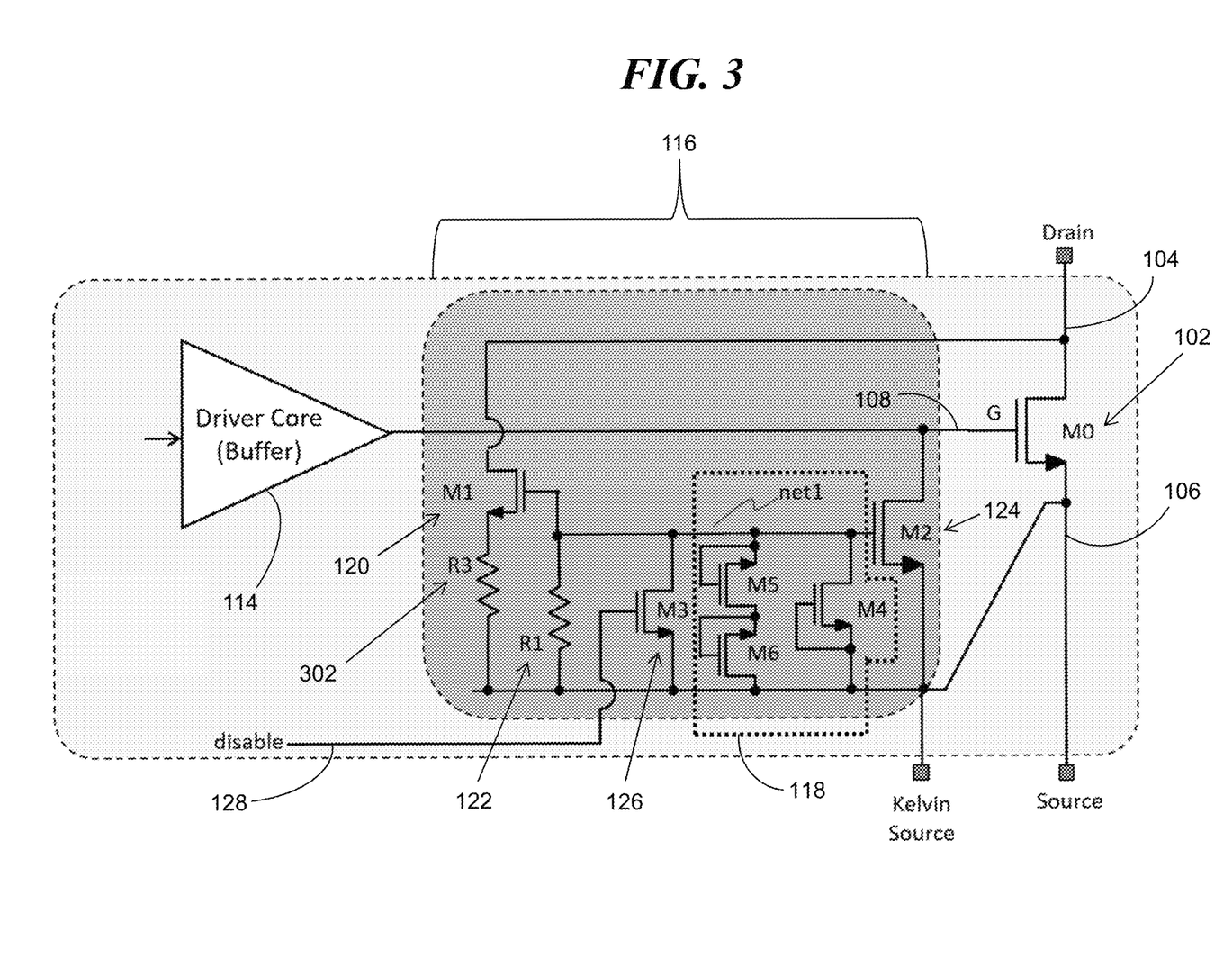
FIG. 3 is a diagram of an example integrated circuit that comprises an alternative circuit topology to the example of FIG. 2, and which includes a protection circuit that can protect a power FET switch from unwanted parasitic turn-on, according to various embodiments of the invention.

FIG. 3 shows an alternative embodiment where the resistor R2 in the voltage clamp 118 is removed, and the source of the device M1 120 is connected to the Kelvin source through resistor R3 302.

In the voltage clamp 118 of FIG. 3, the negative clamp on net1 consists of one GaN device M4 connected as a diode which replaces diode D3 in FIG. 2, whereas the positive clamp on net1 consists of two series GaN devices M5 and M6, each connected as a diode, which replace diodes D1 and D2 in FIG. 2.

Figure 4:
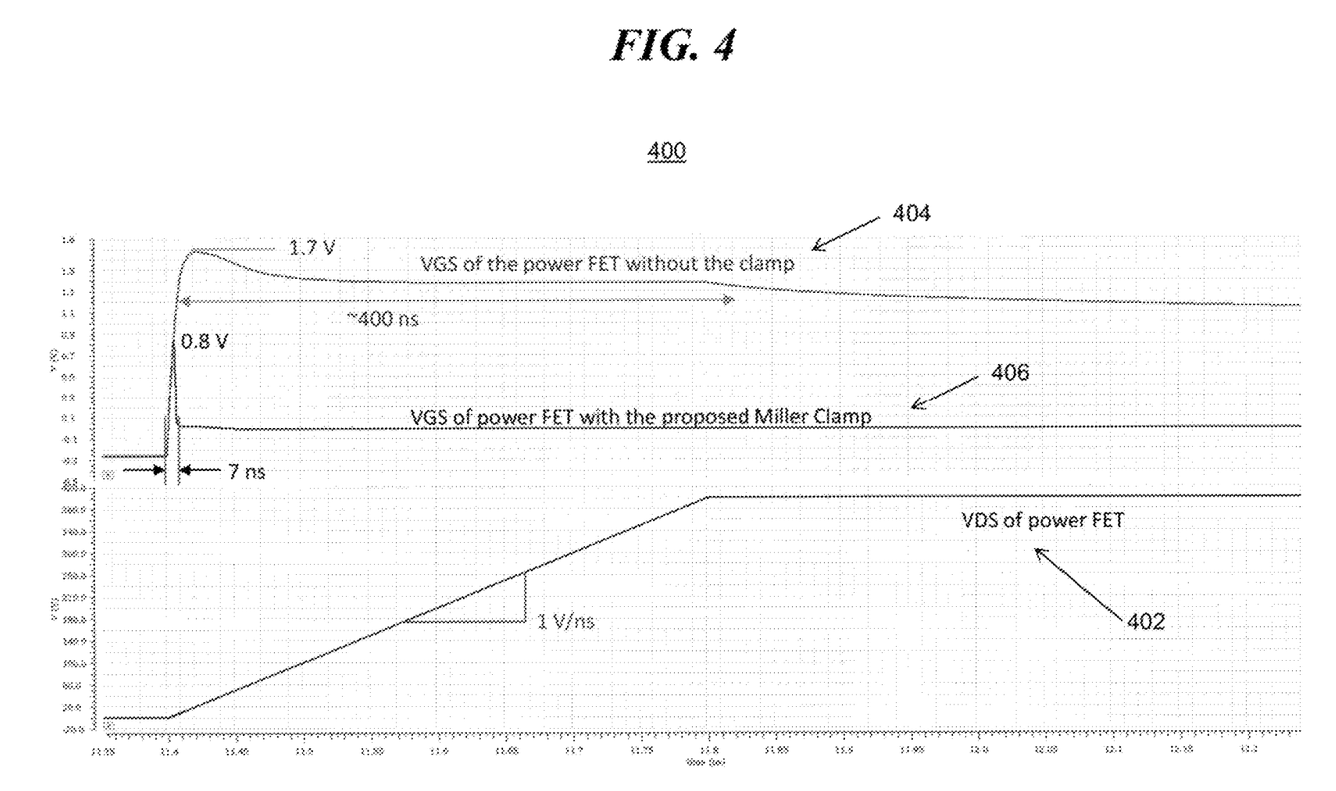
FIG. 4 is a graph of voltage, in the Y-axis, versus time, in the X axis, showing a simulation of operation of an example integrated circuit comprising a power FET switch which undergoes a +dv/dt signal.

FIG. 4 shows multiple plotted curves in a graph of voltage, in the Y-axis, versus time, in the X-axis, illustrating two cases of a simulation of operation of an example integrated circuit comprising a power FET switch which undergoes a +dv/dt signal. The graph also illustrates a comparison between two plotted curves 404, 406. In a first case of operation represented by a first curve 406, an embodiment of the inventive protection circuit can protect the power FET switch from unwanted parasitic turn-on. In a second case of operation represented by a second curve 404, the example integrated circuit does not include the protection circuit. The driver of the power FET switch, in the second case, does not have enough supply and hence does not provide any substantial protection against the +dv/dt signal that can detrimentally affect the power FET switch and/or other electronic circuit devices connected in series to the power FET switch.

More specifically, the graph of FIG. 4 shows a result of a simulation of the operation of an example circuit 100 wherein a gate input G 108 of a power switch (e.g., M0 102) is coupled to the output of a driver circuit (e.g., driver circuit 114), and wherein there is no supply voltage to the driver circuit 114. The voltage across the drain 104 node with respect to the source 106 node is ramped up from 0V to 400V in 400 nsec as shown in the bottom plot of a voltage signal 402.

The gate voltage at the input gate 108 of the power switch 102 is shown for a scenario in which the inventive Miller clamp protection circuit 116 is used, as shown in the middle plot of a voltage signal 406.

The gate voltage at the input gate 108 of the power switch 102 is shown for an alternative scenario in which the inventive Miller clamp protection circuit 116 is not used, as shown in the top plot of a voltage signal 404.

A comparison of the middle plot of the voltage signal 406 to the top plot of the voltage signal 404 shows how the inventive Miller clamp protection circuit 116 dynamically protects the input gate 108 of the power switch 102 from unwanted parasitic dv/dt voltage signals.

On the one hand, without the inventive Miller clamp protection circuit 116 between the driver circuit 114 and the gate 108 of the power switch 102, the input voltage at the gate 108, as shown in the top plot of the voltage signal 404, experiences a sustained voltage increase of about 1.5V to 1.7V which turns on the power switch 102 in response to an unwanted parasitic dv/dt voltage signal. This can cause catastrophic damage to the power switch 102 and to other circuit components in series with the power switch 102.

On the other hand, with the inventive Miller clamp protection circuit 116 in circuit between the driver circuit 114 and the input gate 108 of the power switch 102, the input voltage at the gate 108 of the power switch 102, as shown in the middle plot of the voltage signal 406, experiences only a quick small pulse voltage signal. In the example shown in FIG. 4, the voltage signal at the input gate 108 is approximately 0.8V for about 7 nsec duration. This voltage signal is not sufficient voltage to turn on the power switch 102. Moreover, the duration of this pulse is only 7 nsec after which the voltage falls to below 0.2V level. A voltage signal at the input gate 108, in the simulated example circuit, will only turn on the power switch 102 when the voltage level at the input gate 108 is above 1V.

In summary, according to various embodiments, the novel Miller clamp protection circuit 116 as discussed above can be used to dynamically protect, for example and not for limitation, semiconductor switch devices. This novel Miller clamp protection circuit 116 works in a bias-less fashion. That is, it works even under the case when no supply voltage is available for powering the driver circuit 114 and/or for powering the protection circuit 116. This is a significant advantage of various embodiments of the disclosed invention, and which was not previously available in past attempted solutions to this often-pernicious problem.

The circuit topology of the novel Miller clamp protection circuit 116, as has been discussed above, is different from past attempted solutions to the problem. No other known previous solution has used a capacitor, or an equivalent circuit element, to sense a fast changing parasitic voltage dv/dt at a drain 104 node of an active solid-state switch device 102, and then when a positive voltage change dv/dt signal develops across the drain-to-source nodes 104, 106, of the switch device 102, the voltage clamp 118 is turned on thereby dynamically protecting the input gate 108 node of the switch device 102 from an unwanted parasitic signal that would otherwise turn on the switch device 102. According to various embodiments, the disable clamp 126 in the Miller clamp protection circuit 116 is provided to disable the voltage clamp 118 and thereby to avoid interference with a normal operation of the driver circuit 114 coupled with the gate 108 of the switch device 102.

An advantageous feature of the inventive protection circuit 116 is that it does not need a supply voltage be applied to the driver circuit 114 and/or to the protection circuit 116 for the protection circuit 116 to operate to dynamically protect the switch 102 from unwanted parasitic turn on. This is possible because the inventive circuit uses the electrical energy from the dv/dt event itself to dynamically turn on the protection circuit 116. This feature makes the protection circuit 116 useful in a number of scenarios where a supply voltage for the driver circuit 114 and/or for the protection circuit 116 is either not available, or is still ramping up. For example, during an overall startup operation of an integrated circuit 100 the protection circuit 116 can operate to protect, for example, power switches 102 from unwanted parasitic turn on which otherwise would likely cause catastrophic damage to the power switches 102 and to other circuit elements in series with the power switches 102.

Moreover, inside the integrated circuit 100, for example, the Miller clamp protection circuit 116 can effectively operate to dynamically protect the active solid-state switches 102 in the integrated circuit 100 without needing any external connection pin at the integrated circuit 100, without any external circuit electrically coupled to the Miller clamp protection circuit 116, without any external positive or negative voltage supply electrically coupled to the Miller clamp protection circuit 116, and without any external passive component electrically coupled to the Miller clamp protection circuit 116.

Furthermore, according to various embodiments, the bias-less Miller clamp protection circuit 116 does not consume any quiescent current. That is, the bias-less Miller clamp protection circuit 116 does not consume any current during normal operation of the integrated circuit 100.

Lastly, the inventive protection circuit 116 can be used in a variety of environments, including for protecting semiconductor switches for both low-side and high-side in half-bridge applications.

According to various embodiments, in a method of operation of an electronic circuit inside an integrated circuit chip, the electronic circuit comprises a semiconductor switch device 102 including a drain node 104, a source node 106, and a gate 108, the gate for receiving a driving electrical signal from an output of a driver circuit 114 in the electronic circuit, and a bias-less Miller clamp protection circuit 116, electrically coupled to the output of the driver circuit and to the gate of the semiconductor switch device. The method comprises: electrically coupling a parasitic Miller turn-on signal from the drain node into the bias-less Miller clamp protection circuit 116; and clamping, by the bias-less Miller clamp protection circuit, the gate 108 of the semiconductor switch device 102 to prevent the semiconductor switch device turning from an off state to an on state, in response to the parasitic Miller turn-on signal being electrically coupled into the bias-less Miller clamp protection circuit, wherein the bias-less Miller clamp protection circuit does not consume any current during normal operation of the electronic circuit.

According to various embodiments, in a method of operation of an electronic circuit inside an integrated circuit chip, the electronic circuit comprises a semiconductor switch device 102 including a drain node 104, a source node 106, and a gate 108, the gate for receiving a driving electrical signal from an output of a driver circuit 114 in the electronic circuit, and a bias-less Miller clamp protection circuit 116, electrically coupled to the output of the driver circuit and to the gate of the semiconductor switch device. The method comprises: electrically coupling a parasitic Miller turn-on signal from the drain node into the bias-less Miller clamp protection circuit 116; and clamping, by the bias-less Miller clamp protection circuit, the gate 108 of the semiconductor switch device 102 to prevent the semiconductor switch device turning from an off state to an on state, in response to the parasitic Miller turn-on signal being electrically coupled into the bias-less Miller clamp protection circuit, wherein the bias-less Miller clamp protection circuit does not cause any interference to operation of the driver circuit and the gate of the semiconductor switch device during normal operation of the electronic circuit.

Although specific embodiments of the invention have been disclosed, those having ordinary skill in the art will understand that changes can be made to the specific embodiments without departing from the scope of the invention. The scope of the invention is not to be restricted, therefore, to the specific embodiments, and it is intended that the appended claims cover any and all such applications, modifications, and embodiments within the scope of the present invention.

It should be noted that some features of the present invention might be used in one embodiment thereof without use of other features of the present invention. As such, the foregoing description should be considered as merely illustrative of the principles, teachings, examples, and exemplary embodiments of the present invention, and not a limitation thereof.

In addition, these disclosed embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. An electronic circuit, comprising:
   a GaN semiconductor switch device including a drain node, a source node, and a gate, the gate for receiving an input signal that
      in a first range of signal level, controls an on state of the semiconductor switch device in which a direct electrical connection path in the GaN semiconductor switch device is established between the drain node and the source node, or
      in a second range of signal level, different from the first range, controls an off state of the GaN semiconductor switch device in which the electrical connection path has an impedance approaching an open circuit;
   a driver circuit, having an output that is electrically coupled to the gate of the GaN semiconductor switch device, for providing the input signal to the gate; and
   a bias-less Miller clamp protection circuit, electrically coupled to the output of the driver circuit and to the gate of the GaN semiconductor switch device, for protecting the semiconductor switch device from turning from an off state to an on state in response to a parasitic Miller turn-on signal at the gate while a supply voltage for the driver circuit and for the protection circuit is absent, and wherein the bias-less Miller clamp protection circuit includes:
      a HEMT switch having a drain connected to the gate of the GaN semiconductor switch device, a source connected to the source node of the GaN semiconductor switch device, and having a gate, and
      a first GaN FET having a drain connected to the drain node of the GaN semiconductor switch device and having a gate electrically coupled to the gate of the HEMT switch,
   wherein the GaN semiconductor switch device, the HEMT switch and the first GaN FET are monolithically integrated on a single chip.

2. The electronic circuit of claim 1, wherein the first GaN FET picks up and electrically couples into the bias-less Miller clamp protection circuit the parasitic Miller turn-on signal thereby protecting the GaN semiconductor switch device from turning from an off state to an on state in response to the parasitic Miller turn-on signal.

3. The electronic circuit of claim 2, wherein the bias-less Miller clamp protection circuit includes a voltage clamp, and wherein the gate of the first GaN FET is electrically coupled to the gate of the HEMT switch through the voltage clamp.

4. The electronic circuit of claim 3, wherein the voltage clamp includes a plurality of GaN FETs that each operates like a diode, which clamp excessive positive voltage and/or negative voltage produced in the bias-less Miller clamp protection circuit from the parasitic Miller turn-on signal, and wherein the plurality of GaN FETs are monolithically integrated on the single chip.

5. The electronic circuit of claim 2, wherein the bias-less Miller clamp protection circuit includes a resistor, or a GaN device that operates like a resistor, which discharges voltage produced in the bias-less Miller clamp protection circuit from the parasitic Miller turn-on signal, wherein the electrical energy of the parasitic Miller turn-on signal itself turns on the bias-less Miller clamp protection circuit.

6. The electronic circuit of claim 1, wherein the bias-less Miller clamp protection circuit does not consume any current during normal operation of the electronic circuit.

7. The electronic circuit of claim 1, wherein the bias-less Miller clamp protection circuit does not cause any interference to operation of the driver circuit and the gate of the GaN semiconductor switch device during normal operation of the electronic circuit.

8. The electronic circuit of claim 1, wherein all the devices in the bias-less Miller clamp protection circuit are fabricated in material comprising GaN.

9. The electronic circuit of claim 1, wherein the GaN semiconductor switch device is a high-side switch of a half-bridge and the bias-less Miller clamp protection circuit prevents a false turn-on of the high-side switch due to a positive parasitic Miller turn-on signal occurring across the drain node to source node of the high-side switch.

10. The electronic circuit of claim 1, wherein the GaN semiconductor switch device is a low-side switch of a half-bridge and the bias-less Miller clamp protection circuit prevents a false turn-on of the low-side switch due to a positive parasitic Miller turn-on signal occurring across the drain node to source node of the low-side switch.

11. The electronic circuit of claim 1, wherein the bias-less Miller clamp protection circuit includes a disable clamp that is externally controllable by a disable signal to either
enable the bias-less Miller clamp protection circuit to protect the GaN semiconductor switch device from turning from an off state to an on state; or
disable the bias-less Miller clamp protection circuit from protecting the GaN semiconductor switch device from turning from the off state to the on state.

12. The electronic circuit of claim 1, including a GaN resistor having one end connected to the gate of the first GaN FET and having another end connected to a Kelvin source coupled to the source node of the GaN semiconductor switch device, the GaN resistor for adjusting a reset time of the Miller clamp protection circuit, wherein the GaN resistor is monolithically integrated on the single chip.

13. An GaN integrated circuit chip comprising an electronic circuit that includes:
a GaN power switch including a drain node, a source node coupled to a Kelvin source, and a gate, the gate for receiving an input signal that
in a first range of signal level, controls an on state of the GaN power switch in which a direct electrical connection path in the GaN power switch is established between the drain node and the source node, or
in a second range of signal level, different from the first range, controls an off state of the GaN power switch in which the electrical connection path has an impedance approaching an open circuit;
a driver circuit, having an output that is electrically coupled to the gate of the GaN power switch, for providing the input signal; and
a bias-less Miller clamp protection circuit, electrically coupled to the output of the driver circuit and to the gate of the GaN power switch, for protecting the GaN power switch from turning from an off state to an on state in response to a parasitic Miller turn-on signal at the gate while a supply voltage for the driver circuit and for the protection circuit is absent, and wherein the bias-less Miller clamp protection circuit includes:
a HEMT switch having a drain connected to the gate of the GaN power switch, a source connected to the Kelvin source, and having a gate, and
a capacitor or a device operating like a capacitor, having one side connected to the drain node of the GaN power switch and another side electrically coupled to the gate of the HEMT switch,
wherein the GaN power device and the HEMT switch are monolithically integrated on a single chip.

14. The GaN integrated circuit chip of claim 13, wherein the bias-less Miller clamp protection circuit is entirely located inside the integrated circuit chip without any external connection pin at the integrated circuit chip, without any external positive or negative voltage supply electrically coupled to the bias-less Miller clamp protection circuit, and without any external passive component electrically coupled to the bias-less Miller clamp protection circuit.

15. The GaN integrated circuit chip of claim 13, wherein the bias-less Miller clamp protection circuit does not consume any current during normal operation of the electronic circuit.

16. The GaN integrated circuit chip of claim 13, wherein the capacitor picks up and electrically couples into the bias-less Miller clamp protection circuit the parasitic Miller turn-on signal, thereby protecting the GaN power switch from turning from an off state to an on state in response to the parasitic Miller turn-on signal between the drain node and the gate of the GaN power switch.

17. The electronic circuit of claim 13, wherein the bias-less Miller clamp protection circuit includes a disable HEMT having a gate that is externally controllable by a disable signal such that
when the disable HEMT is off (open circuit), the bias-less Miller clamp protection circuit is enabled, and
when the disable HEMT is on, the bias-less Miller clamp protection circuit is disabled.

18. The electronic circuit of claim 13, wherein the bias-less Miller clamp protection circuit includes a voltage clamp, and wherein other side of the capacitor is electrically coupled to the gate of the HEMT switch through the voltage clamp.

19. A method of operation of an electronic circuit inside an GaN integrated circuit chip, the electronic circuit comprising a GaN power switch including a drain node, a source node, and a gate, the gate for receiving a driving electrical signal from an output of a driver circuit in the electronic circuit, and a bias-less Miller clamp protection circuit electrically coupled to the output of the driver circuit and to the gate of the GaN power switch, the method comprising:
coupling a parasitic Miller turn-on signal from the drain node into the bias-less Miller clamp protection circuit; and
clamping, by the bias-less Miller clamp protection circuit while a supply voltage for the driver circuit and for the protection circuit is absent, the gate of the semiconductor switch device to prevent the GaN power switch turning from an off state to an on state, in response to the parasitic Miller turn-on signal being electrically coupled into the bias-less Miller clamp protection circuit.

20. The method of claim 19, wherein the bias-less Miller clamp protection circuit includes a capacitor, or a device operating like a capacitor, electrically coupled to the drain node and that picks up and electrically couples into the bias-less Miller clamp protection circuit, the parasitic Miller turn-on signal.

* * * * *